US012713837B2

(12) United States Patent
Hong et al.

(10) Patent No.: US 12,713,837 B2
(45) Date of Patent: Aug. 18, 2026

(54) MAGNETIC MEMORY DEVICES

(71) Applicant: SAMSUNG ELECTRONICS CO., LTD., Suwon-si (KR)

(72) Inventors: Kyungil Hong, Suwon-si (KR); Junghwan Park, Suwon-si (KR); Gyuwon Kim, Suwon-si (KR); Yeonho Choi, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 502 days.

(21) Appl. No.: 18/308,401

(22) Filed: Apr. 27, 2023

(65) Prior Publication Data

US 2024/0090338 A1 Mar. 14, 2024

(30) Foreign Application Priority Data

Sep. 13, 2022 (KR) ........................ 10-2022-0115014

(51) Int. Cl.
*H10N 50/10* (2023.01)
*G11C 5/08* (2006.01)
*H10B 61/00* (2023.01)

(52) U.S. Cl.
CPC ............... *H10N 50/10* (2023.02); *G11C 5/08* (2013.01); *H10B 61/22* (2023.02)

(58) Field of Classification Search
None
See application file for complete search history.

(56) References Cited

U.S. PATENT DOCUMENTS

| | | | |
|---|---|---|---|
| 6,839,274 B2 | 1/2005 | Jang et al. | |
| 7,645,699 B2 | 1/2010 | Lee | |
| 9,646,939 B2 | 5/2017 | Zhang et al. | |
| 9,806,027 B2 | 10/2017 | Kim | |
| 9,806,256 B1 | 10/2017 | Wu et al. | |
| 10,199,572 B2 | 2/2019 | Yi et al. | |
| 10,707,413 B1 | 7/2020 | Dutta et al. | |
| 10,833,122 B2 | 11/2020 | Amanapu et al. | |
| 11,302,867 B2 | 4/2022 | Tang et al. | |
| 2017/0110650 A1* | 4/2017 | Park | H10B 61/22 |
| 2019/0259855 A1* | 8/2019 | Cheng | H01L 21/76804 |
| 2021/0242396 A1* | 8/2021 | Kim | H10B 61/20 |
| 2021/0313510 A1 | 10/2021 | Tseng et al. | |
| 2021/0351340 A1 | 11/2021 | Frougier et al. | |

FOREIGN PATENT DOCUMENTS

| | | |
|---|---|---|
| KR | 10-2008-0111903 A | 12/2008 |
| KR | 10-2018-0015005 A | 2/2018 |
| KR | 10-2019-0029855 A | 3/2019 |
| KR | 10-2021-0063528 A | 6/2021 |

* cited by examiner

*Primary Examiner* — Alexander G Ghyka
(74) *Attorney, Agent, or Firm* — Wolf, Greenfield & Sacks, P.C.

(57) ABSTRACT

A magnetic memory device may include a substrate, an data storage pattern disposed on the substrate, and a lower contact plug between the substrate and the data storage pattern, the lower contact plug may include a lower insulating pattern, a lower contact pattern on the lower insulating pattern, and a lower barrier pattern extending along a lower surface and a side surface of the lower insulating pattern and a side surface of the lower contact pattern.

20 Claims, 15 Drawing Sheets

MAGNETIC MEMORY DEVICES

CROSS-REFERENCE TO RELATED APPLICATIONS

This U.S. non-provisional patent application claims priority under 35 U.S.C. § 119 to Korean Patent Application No. 10-2022-0115014, filed on Sep. 13, 2022, in the Korean Intellectual Property Office, the entire contents of which are hereby incorporated by reference.

BACKGROUND OF THE INVENTION

The inventive concept relates to magnetic memory devices including a magnetic tunnel junction.

With high-speed and/or low-power consumption of electronic devices, demands for high-speed and/or low operating voltages of semiconductor memory elements included in the electrical devices have increased. In order to satisfy these demands, a magnetic memory element has been proposed as a semiconductor memory element. The magnetic memory element may have characteristics such as high-speed operation and/or non-volatility, and thus the magnetic memory element has attracted attention as a next-generation semiconductor memory element.

In general, the magnetic memory element may include a magnetic tunnel junction pattern (MTJ). The magnetic tunnel junction pattern may include two magnetic substances and an insulating layer interposed therebetween. A resistance value of the magnetic tunnel junction pattern may vary depending on magnetization directions of the two magnetic substances. For example, when the magnetization directions of the two magnetic substances are antiparallel, the magnetic tunnel junction pattern may have a larger resistance value, and when the magnetization directions of the two magnetic substances are parallel, the magnetic tunnel junction pattern may have a smaller resistance value. Data may be written/read using a difference of resistance values.

According to various demands of the electronic industry, various studies on semiconductor devices having an embedded structure in which a magnetic tunnel junction pattern is disposed between metal wirings are being conducted.

SUMMARY

An object of the inventive concept is to provide magnetic memory devices including a lower contact plug with improved structural stability.

An object of the inventive concept is to provide a method for manufacturing magnetic memory devices with improved stability.

The problem to be solved by the inventive concept is not limited to the problems mentioned above, and other problems not mentioned will be clearly understood by those skilled in the art from the description below.

A magnetic memory device according to some embodiments of the inventive concept may include a substrate, a data storage pattern on the substrate, and a lower contact plug between the substrate and the data storage pattern, wherein the lower contact plug includes a lower insulating pattern on the substrate, a lower contact pattern on the lower insulating pattern, and a lower barrier pattern extending on a lower surface and a side surface of the lower insulating pattern and a side surface of the lower contact pattern.

A magnetic memory device according to some embodiments of the inventive concept may include a substrate, an interlayer insulating layer on the substrate, a lower contact plug in the interlayer insulating layer, and a data storage pattern on the interlayer insulating layer and the lower contact plug. The lower contact plug includes a lower barrier pattern on the substrate, wherein side surfaces of the lower barrier pattern are in contact with the interlayer insulating layer, a lower insulating pattern on the lower barrier pattern, wherein lower surfaces and side surfaces of the lower insulating pattern are in contact with the lower barrier pattern, and a lower contact pattern on the lower insulating pattern. A lower surface of the lower contact pattern is in contact with the lower insulating pattern. A side surface of the lower contact pattern is in contact with the lower barrier pattern.

A magnetic memory device according to some embodiments of the inventive concept may include a substrate, a lower wiring on the substrate, a lower contact plug on the lower wiring, wherein the lower contact plug is connected to the lower wiring, and a data storage pattern including a lower electrode, a magnetic tunnel junction pattern, and an upper electrode sequentially stacked on the lower contact plug. An upper wiring is disposed on the data storage pattern, wherein the upper wiring is connected to the data storage pattern. The lower contact plug includes a lower metal pattern and a lower insulating pattern, wherein the lower metal pattern surrounds the lower insulating pattern, and wherein the lower metal pattern extends between the lower insulating pattern and the lower wiring to be in contact with the lower wiring.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
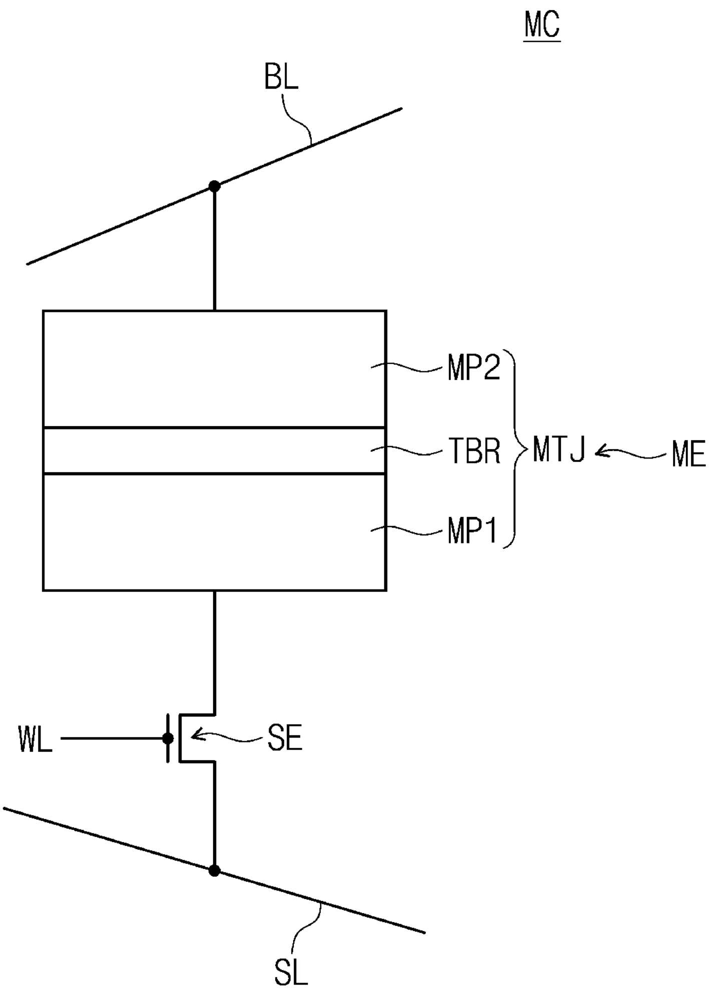
FIG. 1 is a circuit diagram illustrating a unit memory cell of a magnetic memory device according to some embodiments of the inventive concept.

In this specification, like reference numerals may refer to like elements throughout. A magnetic memory device and a manufacturing method thereof according to the inventive concept will be described.

FIG. 1 is a circuit diagram illustrating a unit memory cell of a magnetic memory device according to some embodiments of the inventive concept.

Referring to FIG. 1, a unit memory cell MC may include a memory element ME and a selection element SE. The memory element ME and the selection element SE may be electrically connected to each other (e.g., electrically connected to each other in series). The memory element ME may be (e.g., electrically) connected to and disposed between a bit line BL and the selection element SE. The selection element SE may be (e.g., electrically) connected to and disposed between the memory element ME and a source line SL and may be controlled by a word line WL. The selection element SE may include, for example, a bipolar transistor or a MOS field effect transistor.

The memory element ME may include a magnetic tunnel junction pattern MTJ including first and second magnetic patterns MP1 and MP2 spaced apart from each other and a tunnel barrier pattern TBR between the first and second magnetic patterns MP1 and MP2. One of the first and second magnetic patterns MP1 and MP2 may be a reference magnetic pattern having a magnetization direction fixed in one direction regardless of an external magnetic field under a normal use environment. Another one of the first and second magnetic patterns MP1 and MP2 may be a free magnetic pattern in which a magnetization direction may be changed between two stable magnetization directions by an external magnetic field. An electrical resistance of the magnetic tunnel junction pattern MTJ may be much greater when the magnetization directions of the reference magnetic pattern and the free magnetic pattern are antiparallel to each other than when magnetization directions thereof are parallel to each other. That is, the electrical resistance of the magnetic tunnel junction pattern MTJ may be adjusted by changing the magnetization direction of the free magnetic pattern. Accordingly, the memory element ME may store data in the unit memory cell MC using a difference in electrical resistance depending on the magnetization directions of the reference magnetic pattern and the free magnetic pattern.

Figure 2:
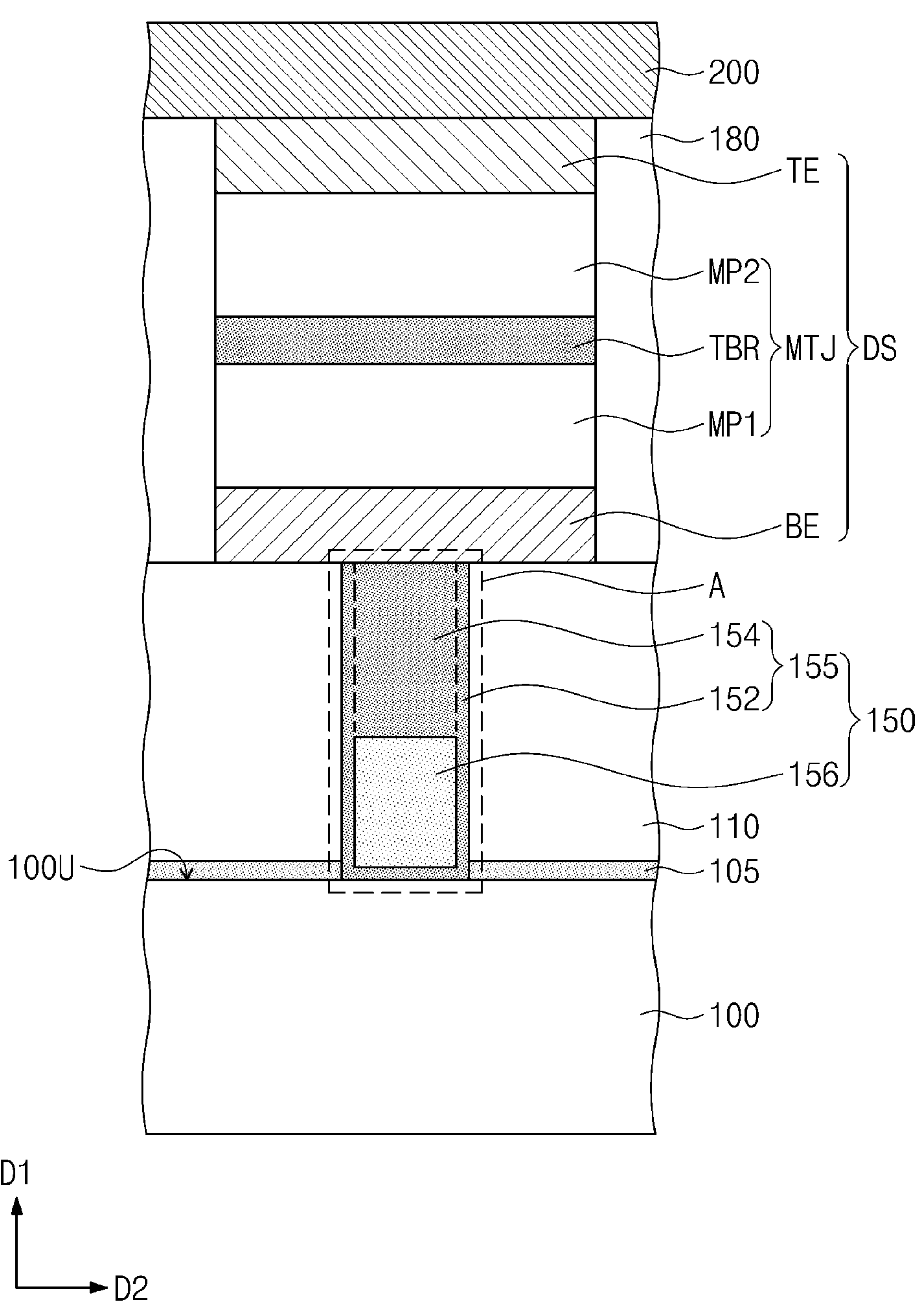
FIG. 2 is a cross-sectional view of a magnetic memory device according to some embodiments of the inventive concept.
Figure 3:
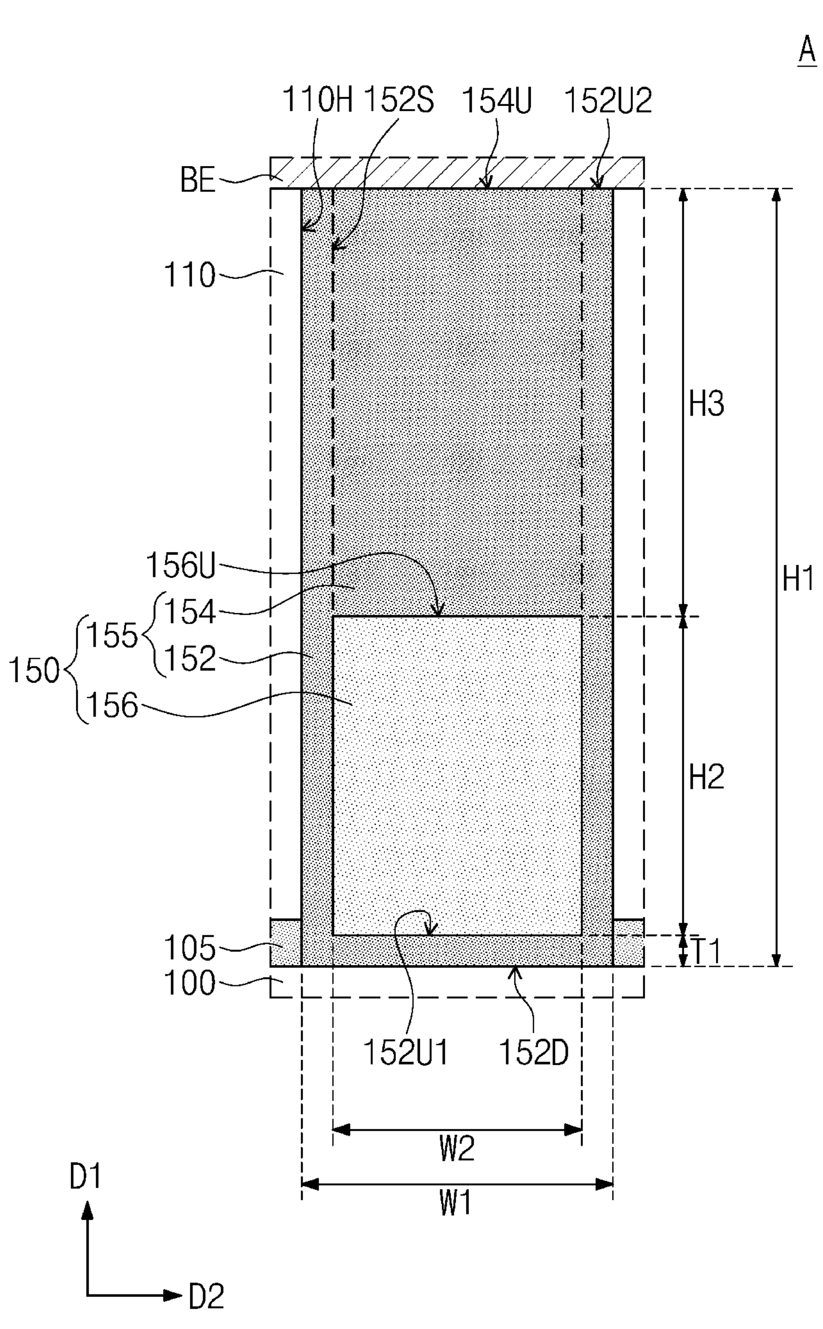
FIG. 3 is an enlarged view of region “A” of FIG. 2.
Figure 4:
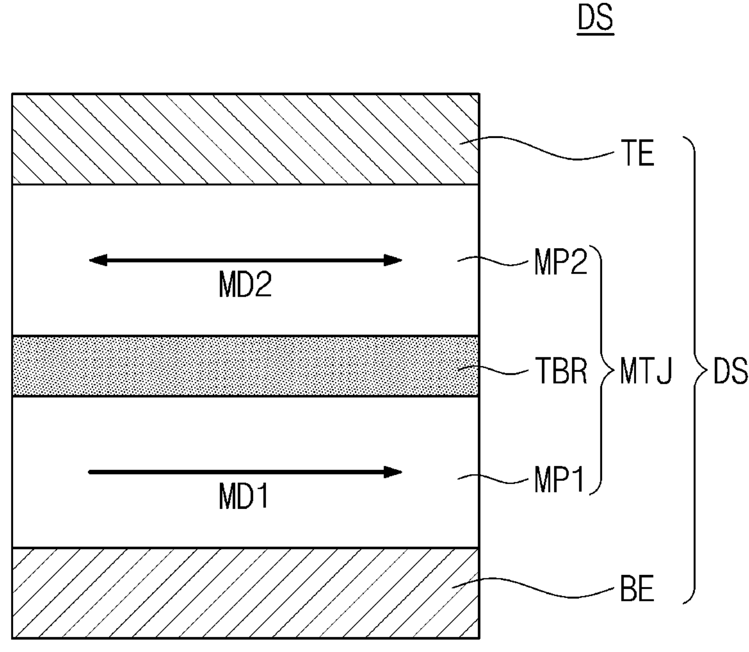
FIGS. 4 and 5 are cross-sectional views respectively illustrating examples of magnetic tunnel junction patterns of a magnetic memory device according to example embodiments.
Figure 5:
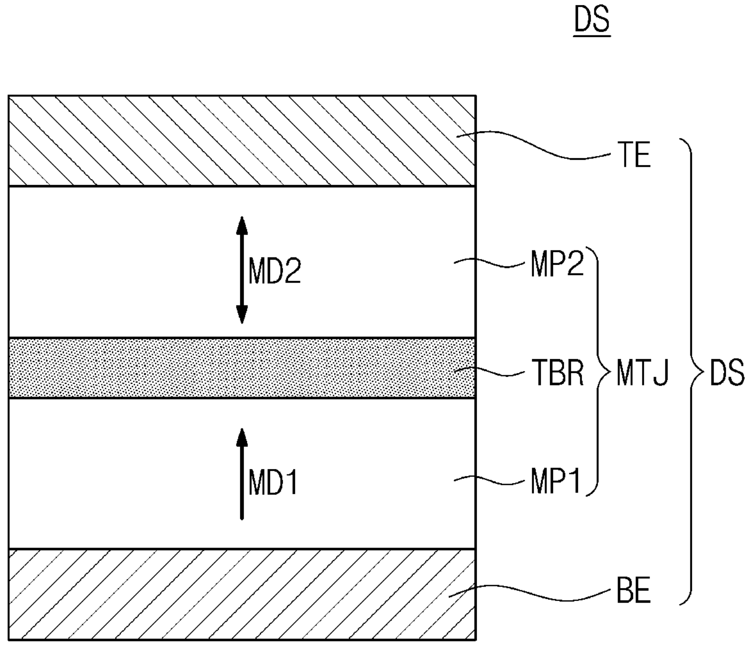

FIG. 2 is a cross-sectional view of a magnetic memory device according to some embodiments of the inventive concept. FIG. 3 is an enlarged view of region “A” of FIG. 2. FIGS. 4 and 5 are cross-sectional views respectively illustrating examples of magnetic tunnel junction patterns of a magnetic memory device according to example embodiments.

Referring to FIG. 2, a magnetic memory device may include a substrate 100, a first interlayer insulating layer 110, a lower contact plug 150, a data storage pattern DS, and an upper wiring 200. The first interlayer insulating layer 110 may be disposed on the substrate 100. The substrate 100 may include a semiconductor substrate including, for example, silicon, silicon on insulator (SOI), silicon germanium (SiGe), germanium (Ge), gallium arsenide (GaAs), and the like. The first interlayer insulating layer 110 may include, for example, oxide, nitride, and/or oxynitride.

The lower contact plug 115 may pass through the first interlayer insulating layer 110 and may be electrically connected to the substrate 100. A selection element (e.g., selection element SE in FIG. 1) may be disposed in the substrate 100, and the selection element may be, for example, a field effect transistor. The lower contact plug 150 may be electrically connected to one terminal (e.g., a source/drain terminal) of the selection element.

The data storage pattern DS may be provided on the lower contact plug 150. The data storage pattern DS may include a lower electrode BE, a magnetic tunnel junction pattern MTJ, and an upper electrode TE. The lower electrode BE, the magnetic tunnel junction pattern MTJ, and the upper electrode TE may be sequentially stacked in a first direction D1 perpendicular to an upper surface 100U of the substrate 100. The lower electrode BE may be disposed between the lower contact plug 150 and the magnetic tunnel junction pattern MTJ, and the magnetic tunnel junction pattern MTJ may be disposed between the lower electrode BE and the upper electrode TE. The lower electrode BE may be electrically connected to the lower contact plug 150. The lower electrode BE may include, for example, a conductive metal nitride (e.g., titanium nitride or tantalum nitride), but not limited thereto. The upper electrode TE may include, for example, a metal (e.g., Ta, W, Ru, Ir, etc.) and/or a conductive metal nitride (e.g., TiN), but not limited thereto.

The magnetic tunnel junction pattern MTJ may include a first magnetic pattern MP1, a second magnetic pattern MP2, and a tunnel barrier pattern TBR therebetween. The first magnetic pattern MP1 may be disposed between the lower electrode BE and the tunnel barrier pattern TBR, and the second magnetic pattern MP2 may be disposed between the upper electrode TE and the tunnel barrier pattern TBR.

A second interlayer insulating layer 180 may be disposed on the first interlayer insulating layer 110. The second interlayer insulating layer 180 may be on a side surface of the lower electrode BE, the magnetic tunnel junction pattern MTJ, and the upper electrode TE. The second interlayer insulating layer 180 may cover side surfaces of the lower electrode BE, the magnetic tunnel junction pattern MTJ, and the upper electrode TE. The second interlayer insulating layer 180 may include, for example, oxide, nitride, and/or oxynitride.

The upper wiring 200 may be disposed on the second interlayer insulating layer 180 and may be (e.g., electrically) connected to the upper electrode TE. The upper wiring 200 may be electrically connected to the magnetic tunnel junction pattern MTJ through the upper electrode TE and may function as the bit line BL of FIG. 1. The upper wiring 200 may include a metal (e.g., copper) and/or a conductive metal nitride, but not limited thereto.

Referring to FIG. 3, the first interlayer insulating layer 110 may include a hole 110H. The hole 110H may pass through the first interlayer insulating layer 110 (e.g., in the first direction D1). The hole 110H may penetrate the first interlayer insulating layer 110. The lower contact plug 150 may be provided in the hole 110H.

The lower contact plug 150 may include a lower metal pattern 155 and a lower insulating pattern 156. The lower metal pattern 155 may be on the lower insulating pattern 156. For example, the lower metal pattern 155 may surround the lower insulating pattern 156. An outer surface of the lower insulating pattern 156 may be in contact with the lower metal pattern 155. The lower insulating pattern 156 may not be in contact with the lower electrode BE and the upper electrode TE. The lower insulating pattern 156 may be spaced apart from the lower electrode BE with the lower metal pattern 155 interposed therebetween. The lower insulating pattern 156 may not be in contact with the first interlayer insulating layer 110. The lower insulating pattern 156 may be spaced apart from the first interlayer insulating layer 110 with the lower metal pattern 155 therebetween. The lower metal pattern 155 may extend between the lower insulating pattern 156 and the substrate 100 to be in contact with the substrate 100. The lower metal pattern 155 may include a conductive metal nitride, but not limited thereto. For example, the lower metal pattern 155 may include TaN and/or TiN. The lower insulating pattern 156 may include oxide, but not limited thereto. For example, the lower insulating pattern 156 may include silicon oxide.

The lower metal pattern 155 may include a lower barrier pattern 152 and a lower contact pattern 154. The lower contact pattern 154 may be on the lower insulating pattern 156. The lower insulating pattern 156 may be disposed within a lower portion of the hole 110H, and the lower contact pattern 154 may be disposed within an upper portion of the hole 110H and on the lower insulating pattern 156. The lower barrier pattern 152 may conformally extend along an inner surface and a bottom surface of the hole 110H. The lower barrier pattern 152 may be interposed between the lower insulating pattern 156 and the substrate 100 and may extend between the lower insulating pattern 156 and the first interlayer insulating layer 110 and between the lower contact pattern 154 and the first interlayer insulating layer 110. The lower barrier pattern 152 may be on the upper surface 100U of the substrate 100. The lower barrier pattern 152 may be on a side surface of the lower insulating pattern. The lower barrier pattern 142 may be on a side surface of the lower contact pattern 154.

A lowermost surface 152D of the lower barrier pattern 152 (in the first direction D1) may be in contact with the upper surface 100U of the substrate 100. An outer surface (e.g., a side surface) of the lower barrier pattern 152 may be in contact with the first interlayer insulating layer 110. The lower barrier pattern 152 may have a first upper surface 152U1 and a second upper surface 152U2. The first upper surface 152U1 of the lower barrier pattern 152 may be in contact with a lower surface of the lower insulating pattern 156, and the second upper surface 152U2 of the lower barrier pattern 152 may be in contact with a lower surface of the lower electrode BE. The first upper surface 152U1 of the lower barrier pattern 152 may be positioned at a lower level than the second upper surface 152U2 of the lower barrier pattern 152. That is, the first upper surface 152U1 of the lower barrier pattern 152 may be positioned at a lower height than the second upper surface 152U2 of the lower barrier pattern 152 (in the first direction D1). The second upper surface 152U2 of the lower barrier pattern 152 may be an uppermost surface of the lower barrier pattern 152.

The lower insulating pattern 156 may be provided on the lower barrier pattern 152 to fill a lower portion of the hole 110H. A lower surface of the lower insulating pattern 156 may be in contact with the first upper surface 152U1 of the lower barrier pattern 152. The lower insulating pattern 156 may be disposed on an inner surface 152S of the lower barrier pattern 152, and thus a side surface of the lower insulating pattern 156 may be in contact with the inner surface 152S of the lower barrier pattern 152.

The lower contact pattern 154 may be provided on the lower barrier pattern 152 and the lower insulating pattern 156. The lower contact pattern 154 may fill an upper portion of the hole 110H. The lower surface of the lower contact pattern 154 may be in contact with an upper surface 156U of the lower insulating pattern 156. The lower contact pattern 154 may be disposed on the inner surface 152S of the lower barrier pattern 152, and thus a side surface of the lower contact pattern 154 may be in contact with the inner surface 152S of the lower barrier pattern 152.

The lower barrier pattern 152 may extend along the lower and side surfaces of the lower insulating pattern 156 and the side surface of the lower contact pattern 154. The upper surface 154U of the lower contact pattern 154 may be positioned at the same height as the second upper surface (e.g., uppermost surface) 152U2 of the lower barrier pattern 152 (in the first direction D1). That is, the upper surface 154U of the lower contact pattern 154 may be coplanar with the second upper surface 152U2 of the lower barrier pattern 152. The upper surface 154U of the lower contact pattern 154 and the second upper surface 152U2 of the lower barrier pattern 152 may be in contact with the lower surface of the lower electrode BE. The lower barrier pattern 152 and the lower contact pattern 154 may include metal nitride, but not limited thereto. For example, the lower barrier pattern 152 and the lower contact pattern 154 may include TaN and/or TiN. When the lower barrier pattern 152 and the lower contact pattern 154 include the same material, an interface between the lower barrier pattern 152 and the lower contact pattern 154 may not be visually distinguished. For example, the lower barrier pattern 152 and the lower contact pattern 154 may be in contact with each other without a visible interface.

The lower contact plug 150 may have a first height H1 in the first direction D1. The lower contact plug 150 may have a first width W1 in a second direction D2 that is parallel to the upper surface 100U of the substrate 100 and perpendicular to the first direction D1. In the present specification, an aspect ratio may mean a ratio of height and width. That is, the aspect ratio may be a value obtained by dividing the height by the width. The aspect ratio of the lower contact plug 150 may be a value obtained by dividing the first height H1 of the lower contact plug 150 by the first width W1 of the lower contact plug 150 (i.e., aspect ratio=H1/W1). The aspect ratio of the lower contact plug 150 may be 0.7 to 1.7. The ratio of the first height H1 of the lower contact plug 150 to the first width W1 of the lower contact plug 150 may range from 1:0.7 to 1:1.7. The first height H1 of the lower contact plug 150 may be 400 angstroms (Å) to 600 Å. For example, the first height H1 of the lower contact plug 150 may be about 500 Å. The first width W1 of the lower contact plug 150 may be 300 Å to 700 Å. For example, the first width W1 of the lower contact plug 150 may be 500 ↑.

The lower barrier pattern 152 may have a first thickness T1 in the first direction D1. The first thickness T1 of the lower barrier pattern 152 may be a vertical length measured in the first direction D1 from the lowermost surface 152D of the lower barrier pattern 152 to the first upper surface 152U1 of the lower barrier pattern 152. The first thickness T1 of the lower barrier pattern 152 may be a vertical length measured from the lowermost surface 152D of the lower barrier pattern 152 to the lower surface of the lower insulating pattern 156 in the first direction D1. The first thickness T1 of the lower barrier pattern 152 may be 50 Å to 150 Å.

The lower insulating pattern 156 may have a second height H2 in the first direction D1. The second height H2 of the lower insulating pattern 156 may be 100 Å to 300 Å. The lower contact pattern 154 may have a third height H3 in the first direction D1. The lower contact pattern 154 may have a second width W2 in the second direction. Accordingly, an aspect ratio of the lower contact pattern 154 may be the ratio of the second width W2 to the third height H3, that is, a value obtained by dividing the third height H3 by the second width W2. For example, the third height H3 may be 50 Å to 350 Å, and the aspect ratio of the lower contact pattern 154 may be 0.1 to 0.7. The ratio of the third height H3 of the lower contact pattern 154 to the second width W2 of the lower contact pattern 154 may be in the range of 1:0.1 to 1:0.7. The embodiments of each width, height, and thickness of the lower contact plug 150, the lower barrier pattern 152, the lower contact pattern 154, and the lower insulating pattern 156 and the ratios therebetween are not limited to the specifications described above.

Referring to FIGS. 4 and 5, the first magnetic pattern MP1 may be a reference layer having a first magnetization direction MD1 fixed in one direction, and the second magnetic pattern MP2 may be a free layer having a second magnetization direction MD2 changeable to be parallel or anti-parallel to the first magnetization direction MD1 of the first magnetic pattern MP1. FIGS. 4 and 5 respectively disclose a case in which the second magnetic pattern MP2 is a free layer as an example, but the inventive concept is not limited thereto. Unlike FIGS. 4 and 5, the first magnetic pattern MP1 may be a free layer and the second magnetic pattern MP2 may be a reference layer. Anti-parallel may herein mean parallel but oppositely directed. Referring to FIG. 4, for example, the first and second magnetization directions MD1 and MD2 of the first magnetic pattern MP1 and the second magnetic pattern MP2 may be parallel to the interface between the tunnel barrier pattern TBR and the second magnetic pattern MP2. In this case, each of the first magnetic pattern MP1 and the second magnetic pattern MP2 may include a ferromagnetic substance. The first magnetic pattern MP1 may further include an antiferromagnetic substance for fixing a magnetization direction of the ferromagnetic substance in the first magnetic pattern MP1. The compositions of the first and second magnetic patterns MP1 and MP2 may not be limited to the specification described above.

Referring to FIG. 5, the first and second magnetization directions MD1 and MD2 of the first magnetic pattern MP1 and the second magnetic pattern MP2 may be perpendicular to an interface between the tunnel barrier pattern TBR and the second magnetic pattern MP2. In this case, for example, each of the first magnetic pattern MP1 and the second magnetic pattern MP2 may include an intrinsic perpendicular magnetic substance and/or an extrinsic perpendicular magnetic substance. The intrinsic perpendicular magnetic substance may include a material having perpendicular magnetization characteristics even when there is no external factor. The intrinsic perpendicular magnetic substance may include i) perpendicular magnetic substance (e.g., CoFeTb, CoFeGd, CoFeDy), ii) perpendicular magnetic substance having an L10 structure, iii) CoPt having a hexagonal close packed lattice structure, and/or iv) perpendicular magnetic structures, but not limited thereto. The perpendicular magnetic substance having the L10 structure may include FePt of L10 structure, FePd of L10 structure, CoPd of L10 structure, and/or CoPt of L10 structure, but not limited thereto. The perpendicular magnetic structures may include magnetic layers and non-magnetic layers that are alternately and repeatedly stacked. For example, the perpendicular magnetic structures may include (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n ("n" is the number of stacking). The extrinsic perpendicular magnetic substance may include a material having intrinsic horizontal magnetization characteristics and perpendicular magnetization characteristics due to an external factor. For example, the extrinsic perpendicular magnetic substance may have the perpendicular magnetization characteristics due to magnetic anisotropy induced by making a junction of the first magnetic pattern MP1 (or the second magnetic pattern MP2) and the tunnel barrier pattern TBR. The extrinsic perpendicular magnetic substance may include, for example, CoFeB.

Each of the first magnetic pattern MP1 and the second magnetic pattern MP2 may include, for example, a Co-based Heusler alloy. The tunnel barrier pattern TBR may include a magnesium (Mg) oxide layer, a titanium (Ti) oxide layer, an aluminum (Al) oxide layer, a magnesium-zinc (Mg—Zn) oxide layer, and/or a magnesium-boron (Mg—B) oxide layer, but not limited thereto.

Referring back to FIG. 2, the magnetic memory device may further include an etching stop layer 105. The etching stop layer 105 may be provided on the substrate 100. The etching stop layer 105 may be interposed between the substrate 100 and the first interlayer insulating layer 110. The lower contact plug 150 may pass through the etching stop layer 105. At least a portion of an outer surface (e.g., outer side surface) of the lower contact plug 150 may be in contact with the etching stop layer 105. The etching stop layer 105 may include a material different from that of the first interlayer insulating layer 110. The etching stop layer 105 may include, for example, silicon nitride (e.g., SiCN), silicon oxide, and/or metal nitride (e.g., AlN).

As the magnetic memory device according to the embodiment may include the lower insulating pattern 156 in the lower contact plug 150, the aspect ratio (e.g., H3 divided by W2) of the lower contact pattern 154 may be reduced while the overall height (e.g., H1) and width (e.g., W1) of the lower contact plug 150 are maintained. The aspect ratio of the lower contact pattern 154 may be reduced, and thus structural stability of the lower contact plug 150 may be improved, and the lower electrode BE may be in stable contact with the lower contact plug 150.

Figure 6:
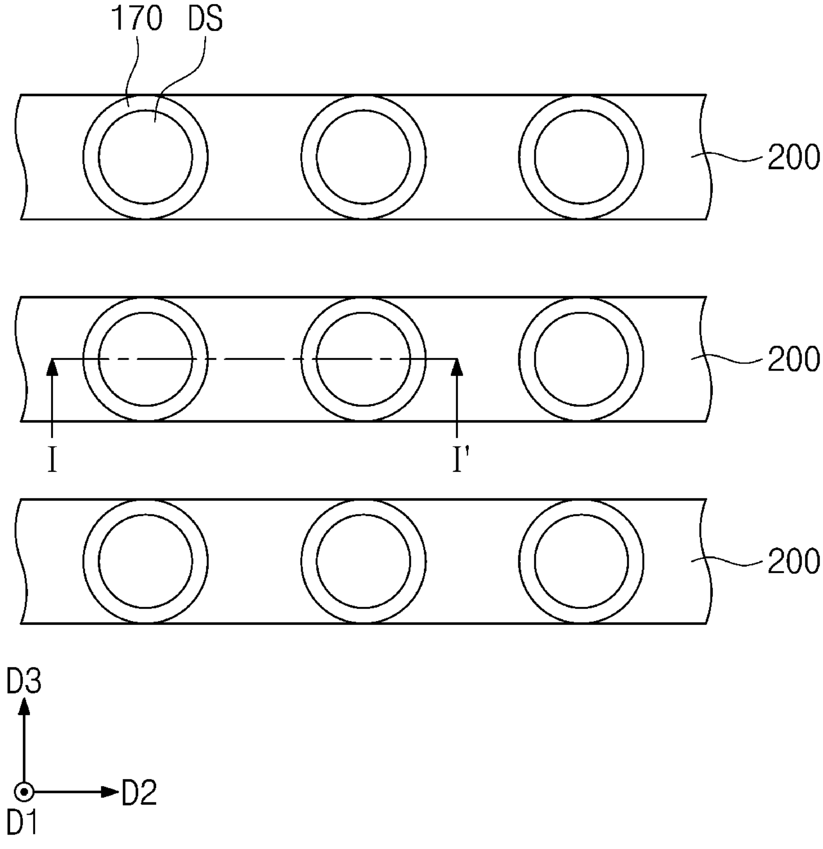
FIG. 6 is a plan view of a magnetic memory device according to some embodiments of the inventive concept.
Figure 7:
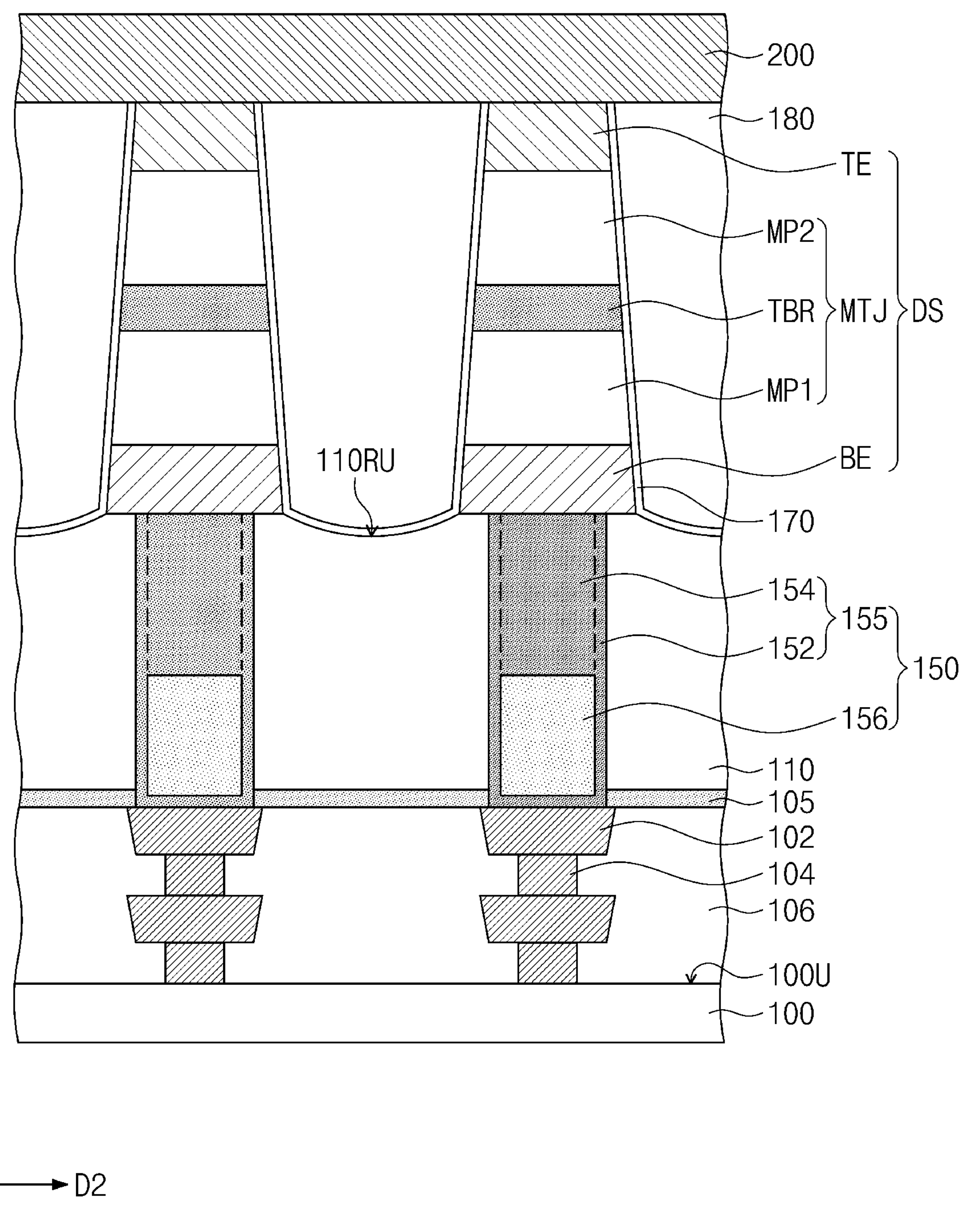
FIG. 7 is a cross-sectional view taken along line I-I' of FIG. 6.

FIG. 6 is a plan view of a magnetic memory device according to some embodiments of the inventive concept, and FIG. 7 is a cross-sectional view taken along line I-I' of FIG. 6. For simplicity of description, descriptions overlapping those of the magnetic memory device described with reference to FIGS. 1 to 5 will be omitted.

Referring to FIGS. 6 and 7, lower wirings 102 and lower contacts 104 may be disposed on a substrate 100. The lower wirings 102 may be spaced apart from an upper surface 100U of the substrate 100 in a first direction D1 perpendicular to the upper surface 100U of the substrate 100. The lower contacts 104 may be disposed between the substrate 100 and the lower wiring 102, and each of the lower wirings 102 may be electrically connected to the substrate 100 through a corresponding one of the lower contacts 104. The lower wiring 102 and the lower contacts 104 may include metal (e.g., copper), but not limited thereto.

Selection elements (SE in FIG. 1) may be disposed within the substrate 100. The selection elements may be, for example, field effect transistors. Each of the lower wiring 102 may be electrically connected to a terminal (e.g., a source/drain terminal) of a corresponding one of the selection elements through a corresponding lower contact 104.

A lower interlayer insulating layer 106 may be disposed on the substrate 100. The lower interlayer insulating layer 106 may be on the lower wiring 102 and the lower contacts 104. For example, the lower interlayer 106 may cover the lower wiring 102 and the lower contacts 104. Upper surfaces of the uppermost lower wirings 102 among the lower wirings 102 may be coplanar with an upper surface of the lower interlayer insulating layer 106. The upper surfaces of the uppermost lower wiring 102 may be positioned at substantially the same height as the upper surface of the lower interlayer insulating layer 106. In this specification, height means a distance measured in the first direction D1 from the upper surface 100U of the substrate 100. The lower interlayer insulating layer 106 may include, for example, oxide, nitride, and/or oxynitride.

A first interlayer insulating layer 110 may be disposed on the lower interlayer insulating layer 106. The first interlayer insulating layer 110 may cover the upper surfaces of the uppermost lower wirings 102.

At least a portion of a plurality of lower contact plugs 150 may be disposed in the first interlayer insulating layer 110. The plurality of lower contact plugs 150 may be spaced apart from each other in second and third directions D2 and D3 parallel to the upper surface 100U of the substrate 100. The second direction D2 and the third direction D3 may intersect each other. Each of the plurality of lower contact plugs 150 may pass through the first interlayer insulating layer 110 and may be (e.g., electrically) connected to a corresponding lower wiring 102 among the uppermost lower wiring 102. Each of the plurality of lower contact plugs 150 may be electrically connected to a terminal (e.g., a source/drain terminal) of a corresponding one of the selection elements through a corresponding lower wiring 102.

Each of the plurality of lower contact plugs 150 may be the lower contact plug 150 described with reference to FIGS. 2 and 3. Each of the upper surfaces of the uppermost lower wirings 102 may be in contact with a lower surface of a lower barrier pattern 152. A lower metal pattern 155 (e.g., the lower barrier pattern 152) may extend between the lower insulating pattern 156 and a corresponding lower wiring 102 among the uppermost lower wirings 102 and may be in contact with the corresponding lower wiring 102.

A plurality of data storage patterns DS may be disposed on the first interlayer insulating layer 110 and may be spaced apart from each other in the second direction D2 and the third direction D3. The plurality of data storage patterns DS may be respectively disposed on the plurality of lower contact plugs 150 and may be respectively (e.g., electrically) connected to the plurality of lower contact plugs 150. The data storage pattern DS may be the data storage pattern DS described with reference to FIGS. 4 and 5.

According to some embodiments, an upper surface of the first interlayer insulating layer 110 may be recessed toward the substrate 100 between the plurality of data storage patterns DS. A protective insulating layer 170 may be on (e.g., surround) each side surface of the plurality of data storage patterns DS. For example, the protective insulating layer 170 may be on (e.g., cover) side surfaces of a lower electrode BE, a magnetic tunnel junction pattern MTJ, and an upper electrode TE. The protective insulating layer 170 may surround the side surfaces of the lower electrode BE, the magnetic tunnel junction pattern MTJ, and the upper electrode TE, when viewed from a plan view. The protective insulating layer 170 may extend from each side of the plurality of data storage patterns DS onto a recessed upper surface 110RU of the first interlayer insulating layer 110. The protective insulating layer 170 may conformally cover the recessed upper surface 110RU of the first interlayer insulating layer 110. The protective insulating layer 170 may include nitride (e.g., silicon nitride), but not limited thereto.

A second interlayer insulating layer 180 may be disposed on the first interlayer insulating layer 110. The second interlayer insulating layer 180 may be on (e.g., cover) the plurality of data storage patterns DS. The protective insulating layer 170 may be interposed between each side surface of the plurality of data storage patterns DS and the second interlayer insulating layer 180. The protective insulating layer 170 may extend between the recessed upper surface 110RU of the first interlayer insulating layer 110 and the second interlayer insulating layer 180.

A plurality of upper wirings 200 may be disposed on the second interlayer insulating layer 180. The plurality of upper wirings 200 may extend in the second direction D2 and may be spaced apart from each other in the third direction D3. Each of the plurality of upper wirings 200 may be (e.g., electrically) connected to data storage patterns DS spaced apart from each other in the second direction D2 among the plurality of data storage patterns DS.

FIGS. 8 to 16 are views illustrating a method of manufacturing a magnetic memory device according to some embodiments of the inventive concept, and are cross-sectional views corresponding to line I-I' of FIG. 6. For simplicity of explanation, descriptions overlapping with those of the magnetic memory device described with reference to FIGS. 1 to 7 will be omitted.

Figure 8:
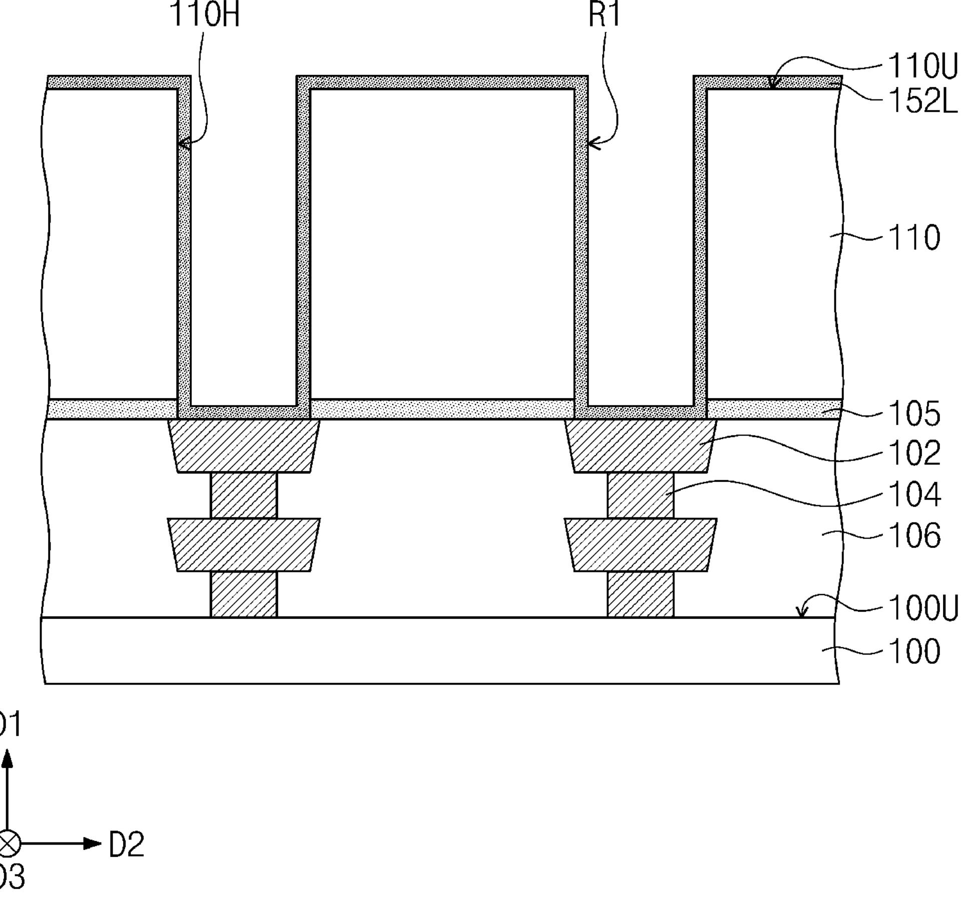
FIGS. 8 to 16 are views illustrating a method of manufacturing a magnetic memory device according to some embodiments of the inventive concept, and are cross-sectional views corresponding to line I-I' of FIG. 6.

Referring to FIG. 8, selection elements (SE of FIG. 1) may be formed in the substrate 100, and lower wirings 102 and lower contacts 104 may be formed on a substrate 100. Each of the lower wirings 102 may be electrically connected to one terminal (e.g., a source/drain terminal) of a corresponding one of the selection elements through a corresponding one of the lower contacts 104. A lower interlayer insulating layer 106 may be formed on the substrate 100. The lower interlayer insulating layer 106 may be on (e.g., cover) the lower wirings 102 and the lower contacts 104. Upper surfaces of uppermost lower wirings 102 among the lower wirings 102 may be coplanar with an upper surface of the lower interlayer insulating layer 106.

A first interlayer insulating layer 110 may be formed on the lower interlayer insulating layer 106, and a hole 110H may be formed in the first interlayer insulating layer 110. The hole 110H may pass through the first interlayer insulating layer 110 and expose a portion of the upper surface of the corresponding one of the uppermost lower wirings 102. A lower barrier layer 152L may be conformally formed on an upper surface 110U of the first interlayer insulating layer 110 and the exposed upper surface of the uppermost lower wiring 102. The lower barrier layer 152L may be formed on an inner side surface of the hole 100H. The lower barrier layer 152L may cover the upper surface 110U of the first interlayer insulating layer 110 and inner and bottom surfaces of the hole 110H. Accordingly, a first recess region R1 may be formed. The forming of the lower barrier layer 152L may be performed by a deposition process. For example, the forming of the lower barrier layer 152L may be performed by physical vapor deposition.

Figure 9:
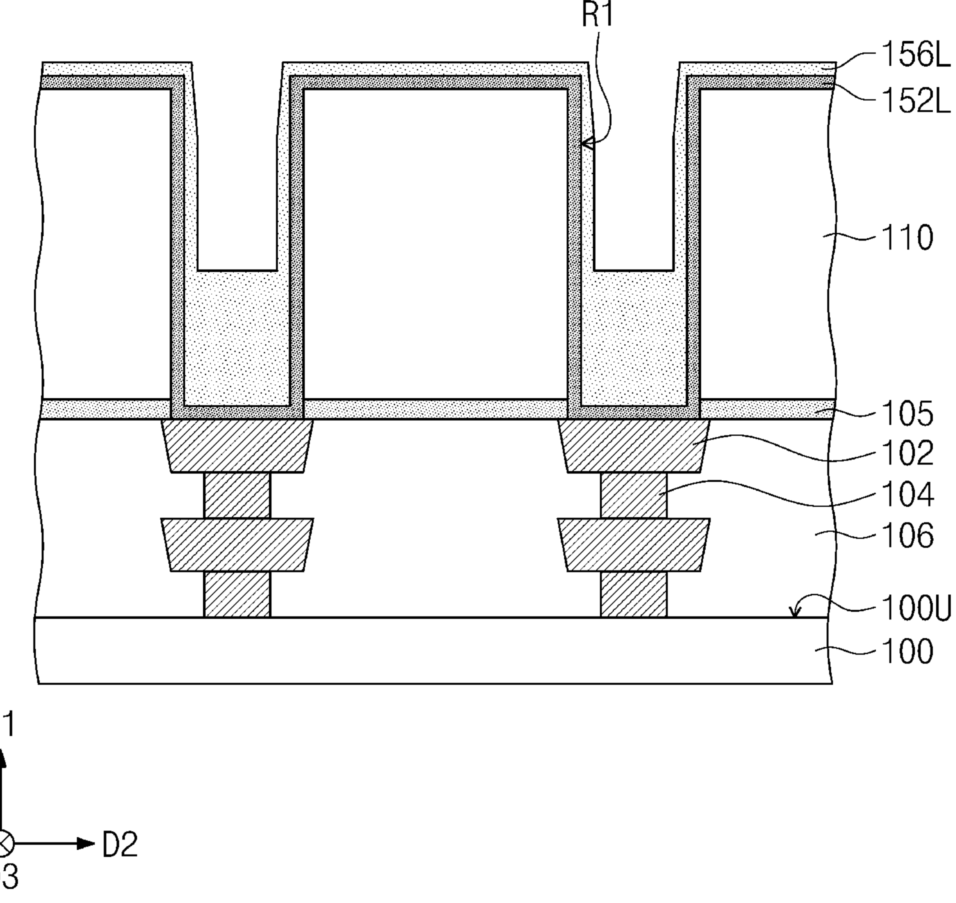

Referring to FIG. 9, a lower insulating layer 156L may be formed on the lower barrier layer 152L. The lower insulating layer 156L may cover the lower barrier layer 152L. The lower insulating layer 156L may partially fill the first recess region R1. The forming of the lower insulating layer 156L may be performed by a deposition process (e.g., a chemical vapor deposition process).

Figure 10:
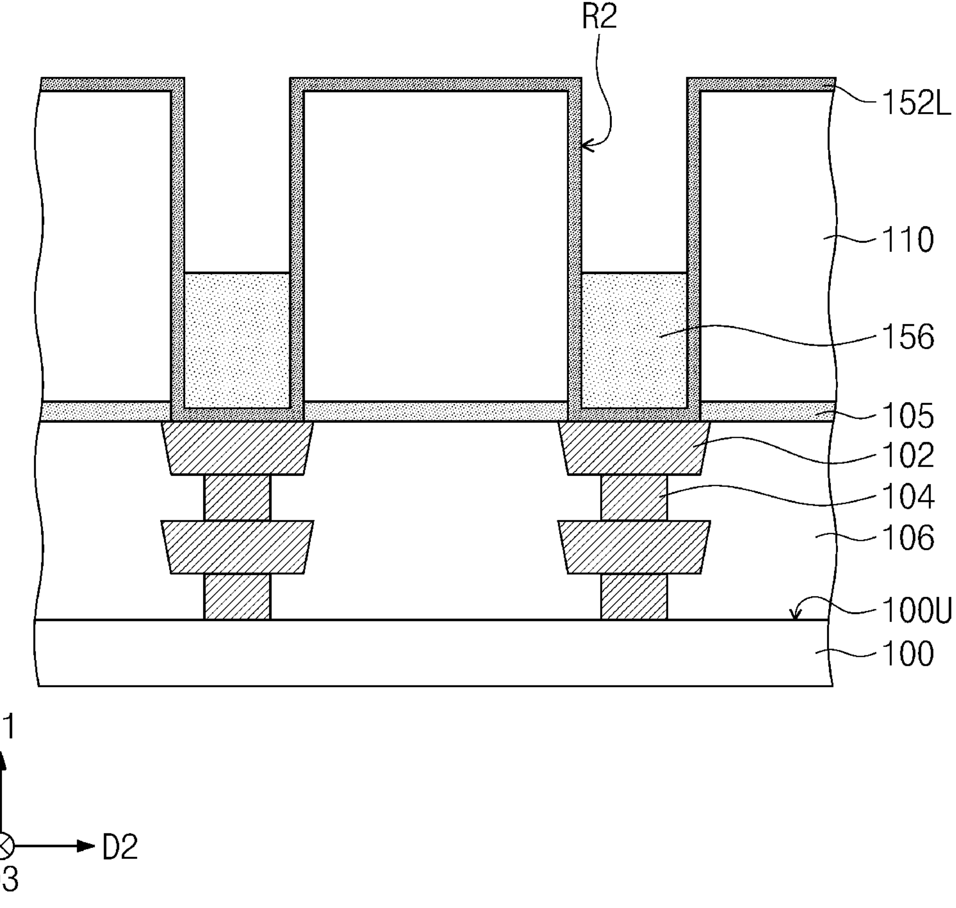

Referring to FIG. 10, a lower insulating pattern 156 may be formed. The lower insulating pattern 156 may be formed by performing an etching process on the lower insulating layer 156L. At least a portion of the lower barrier layer 152L may be exposed by the etching process. Accordingly, a second recess region R2 may be formed in the hole 110H.

Figure 11:
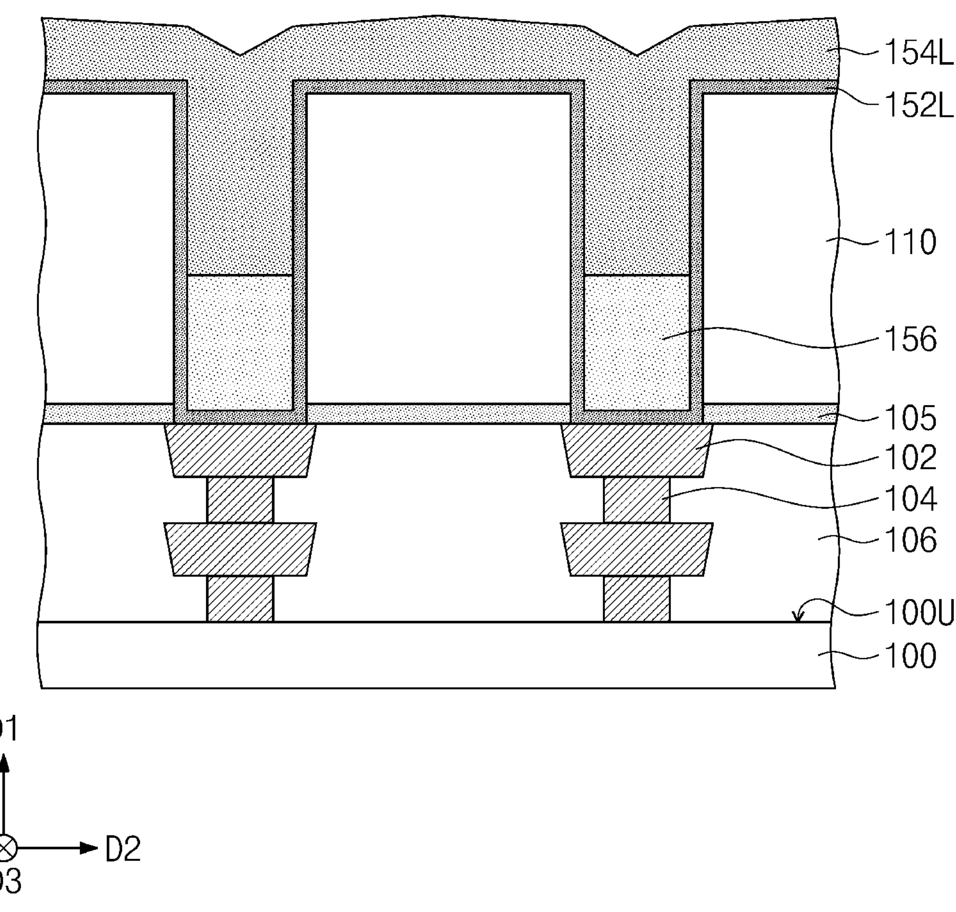

Referring to FIG. 11, a lower contact layer 154L may be formed on the lower barrier layer 152L and the lower insulating pattern 156. The lower contact layer 154L may fill the second recess region R2. The lower contact layer 154L may cover a portion of the upper surface of the lower barrier layer 152L and an upper surface of the lower insulating pattern 156. The forming of the lower contact layer 154L may be performed by a deposition process. For example, the forming of the lower contact layer 154L may be performed by physical vapor deposition.

Figure 12:
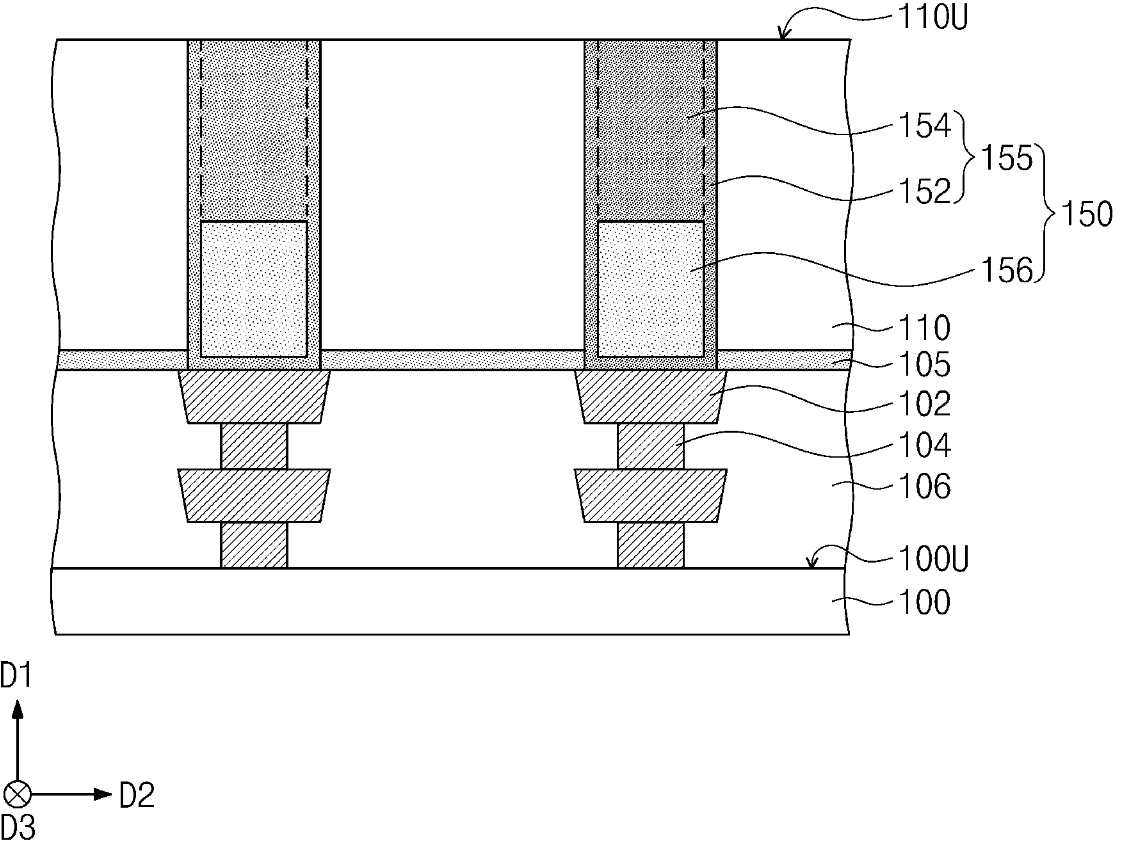

Referring to FIG. 12, a planarization (e.g., chemical mechanical planarization) process may be performed on the lower contact layer 154L and the lower barrier layer 152L to form the lower contact pattern 154 and the lower barrier pattern 152. The planarization process may be performed until an upper surface 110U of the first interlayer insulating layer 110 is exposed. Accordingly, the lower contact plug 150 may be formed.

Figure 13:
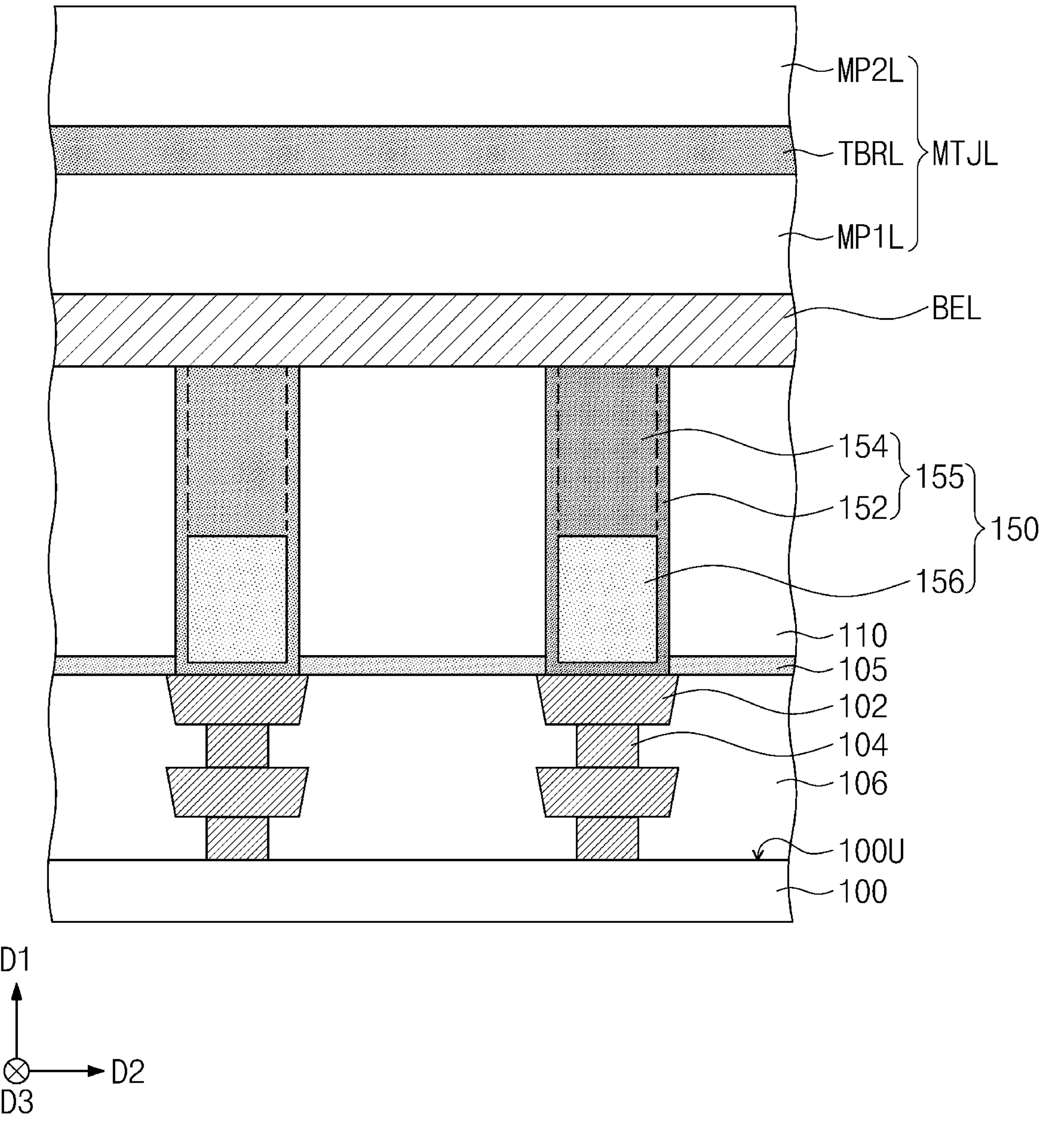

Referring to FIG. 13, a lower electrode layer BEL and a magnetic tunnel junction layer MTJL may be (e.g., sequentially) formed on the first interlayer insulating layer 110. In some embodiments, the magnetic tunnel junction layer MTJL may include a first magnetic layer MP1L, a tunnel barrier layer TBRL, and a second magnetic layer MP2L (e.g., sequentially) stacked on the lower electrode layer BEL. The magnetic tunnel junction layer MTJL and the lower electrode layer BEL may be formed by, for example, sputtering, chemical vapor deposition, or atomic layer deposition, but not limited thereto.

Figure 14:
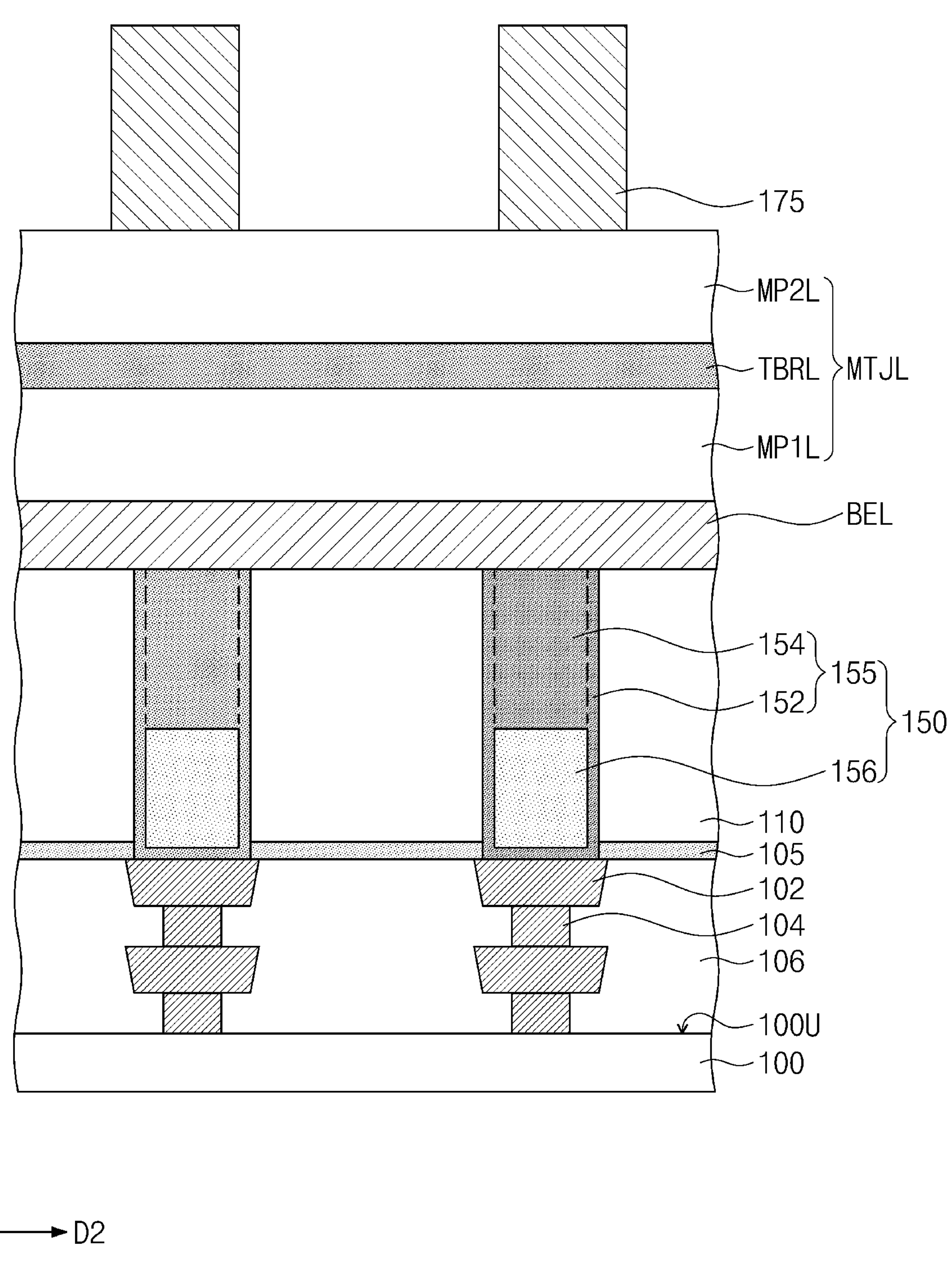

Referring to FIG. 14, conductive mask patterns 175 may be formed on the magnetic tunnel junction layer MTJL. The conductive mask patterns 175 may define regions where magnetic tunnel junction patterns, which will be described later, are to be formed. The conductive mask patterns 175 may include, for example, a metal (e.g., Ta, W, Ru, Ir, etc.) and/or a conductive metal nitride (e.g., TiN).

Figure 15:
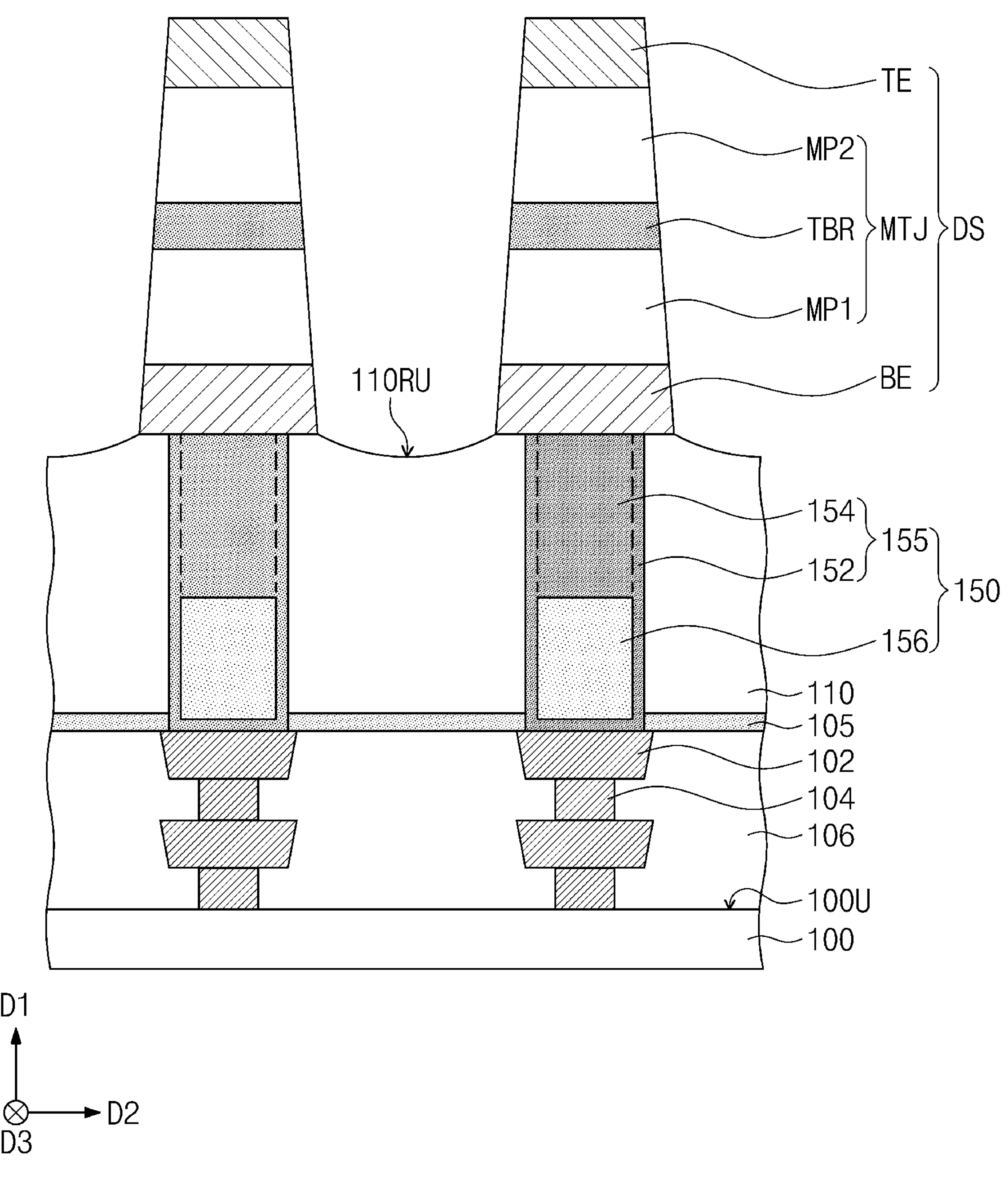

Referring to FIG. 15, the magnetic tunnel junction layer MTJL and the lower electrode layer BEL may be (e.g., sequentially) etched using the conductive mask patterns 175 as an etch mask. Accordingly, a magnetic tunnel junction pattern MTJ and a lower electrode BE may be formed on the first interlayer insulating layer 110. The lower electrode BE may be (e.g., electrically) connected to the corresponding lower contact plug 150, and the magnetic tunnel junction pattern MTJ may be formed on the lower electrode BE. As the magnetic tunnel junction layer MTJL and the lower electrode layer BEL are etched, the magnetic tunnel junction pattern MTJ and the lower electrode BE may be formed, respectively. The magnetic tunnel junction pattern MTJ may include a first magnetic pattern MP1, a tunnel barrier pattern TBR, and a second magnetic pattern MP2 (e.g., sequentially) stacked on the lower electrode BE. Each of the second magnetic layer MP2L, the tunnel barrier layer TBRL, and the first magnetic layer MP1L may be sequentially etched using the conductive mask pattern 175 as an etching mask, to form the second magnetic pattern MP2, the tunnel barrier pattern TBR, and the first magnetic pattern MP1. After the magnetic tunnel junction pattern MTJ and the lower electrode BE are formed, a remainder of the conductive mask pattern 175 may remain on the magnetic tunnel junction pattern MTJ. The remainder of the conductive mask pattern 175 may function as an upper electrode TE. The lower electrode BE, the magnetic tunnel junction pattern MTJ, and the upper electrode TE may be referred to as a data storage pattern DS.

The etching process of etching the magnetic tunnel junction layer MTJL and the lower electrode layer BEL may be, for example, an ion beam etching process using an ion beam. The ion beam may include inert ions. Through the ion beam etching process, a portion of upper surfaces of the first interlayer insulating layer 110 may be recessed at both sides of the magnetic tunnel junction pattern MTJ. Accordingly, the first interlayer insulating layer 110 may have a recessed upper surface 110RU of the first interlayer insulating layer 110 recessed from both sides of the magnetic tunnel junction pattern MTJ.

Figure 16:
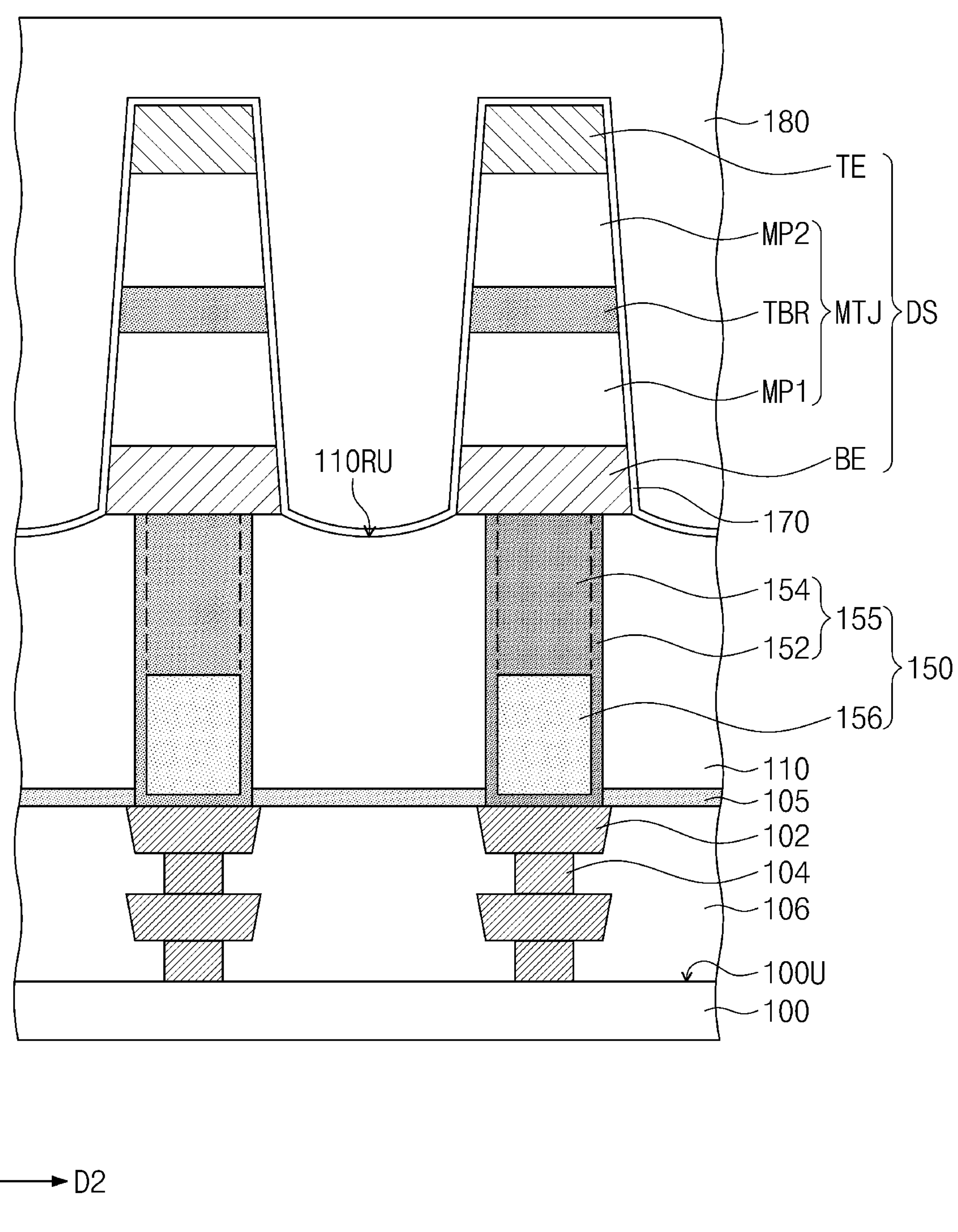

Referring to FIG. 16, a protective insulating layer 170 may be formed on the first interlayer insulating layer 110. The protective insulating layer 170 may be formed on the data storage pattern. The protective insulating layer 170 may cover the data storage pattern DS. The protective insulating layer 170 may be formed to conformally cover upper and side surfaces of the data storage pattern DS and may extend along the recessed upper surface 110RU of the first interlayer insulating layer 110. A second interlayer insulating layer 180 may be formed on the protective insulating layer 170. The second interlayer insulating layer 180 may be on (e.g., cover) the data storage pattern DS.

Referring back to FIG. 7, portions of the second interlayer insulating layer 180 and the protective insulating layer 170 may be removed, and an upper surface of the upper electrode TE of the data storage pattern DS may be exposed. An upper wiring 200 may be formed on the second interlayer insulating layer 180 and the exposed upper surface of the upper electrode TE. The upper wiring 200 may cover the exposed upper surface of the upper electrode TE. The upper wiring 200 may be electrically connected to the upper electrode TE. Accordingly, a magnetic memory element may be manufactured.

The lower contact plug 150 may be formed through the above process, and thus there may be no void in the lower contact plug 150. In addition, the lower contact plug 150 may be formed by a physical vapor deposition (PVD) process, and thus chemical interference with the magnetic junction pattern MTJ may be minimized. Thus, the lower contact plug 150 with high stability may be manufactured.

According to the inventive concept, the lower contact plug of the magnetic memory device may include the lower insulating pattern therein. Accordingly, the aspect ratio of the lower contact pattern may be reduced while the height and width of the lower contact plug are maintained. The aspect ratio of the lower contact pattern may be reduced, and thus the structural stability of the lower contact plug may be improved, and the lower electrode and the lower contact plug may be in stable contact with each other.

According to the inventive concept, in the method of manufacturing the magnetic memory device, the lower contact plug may include the lower insulating pattern therein, and there may be no void in the lower contact plug. In addition, the lower contact plug may be formed by the physical vapor deposition (PVD) process, the chemical interference with the magnetic junction pattern may be minimized. Accordingly, the lower contact plug having high stability may be manufactured.

While embodiments are described above, a person skilled in the art may understand that many modifications and variations are made without departing from the spirit and scope of the inventive concept defined in the following claims. Accordingly, the example embodiments of the inventive concept should be considered in all respects as illustrative and not restrictive, with the spirit and scope of the inventive concept being indicated by the appended claims.

It should also be noted that in some alternate implementations, the steps of the method of manufacturing herein may occur out of the order. For example, two steps described in succession may in fact be executed substantially concurrently or the steps may sometimes be executed in the reverse order. Moreover, the steps of method may be separated into multiple steps and/or may be at least partially integrated. Finally, other steps may be added/inserted between the steps that are illustrated, and/or the steps may be omitted without departing from the scope of the present invention.

The terminology used herein is for the purpose of describing particular embodiments only and is not intended to be limiting of the disclosure. As used herein, the singular forms “a,” “an,” and “the” are intended to include the plural forms as well, unless the context clearly indicates otherwise. It will be further understood that the terms “comprises,” “comprising,” “includes,” and/or “including,” when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. In addition, "electrical connection" conceptually includes a physical connection and a physical disconnection. As used herein, the term "and/or" includes any and all combinations of one or more of the associated listed items. Moreover, the symbol "/" will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. A magnetic memory device comprising:

a substrate;

a data storage pattern on the substrate; and a lower contact plug between the substrate and the data storage pattern, wherein the lower contact plug includes:

a lower insulating pattern on the substrate;

a lower contact pattern above the lower insulating pattern; and a lower barrier pattern extending on a lower surface and a side surface of the lower insulating pattern and a side surface of the lower contact pattern, wherein the lower barrier pattern extends at least on a portion of the side surface of the lower contact pattern that is above an uppermost surface of the lower insulating pattern.

2. The magnetic memory device of claim 1, wherein the data storage pattern includes a lower electrode, a magnetic tunnel junction pattern, and an upper electrode stacked on the lower contact plug.

3. The magnetic memory device of claim 1, wherein the lower contact pattern and the lower barrier pattern include TaN and/or TiN, and wherein the lower insulating pattern includes oxide.

4. The magnetic memory device of claim 1, wherein the lower contact plug has a first height in a first direction perpendicular to an upper surface of the substrate and a first width in a second direction parallel to the upper surface of the substrate, and wherein a ratio of the first width to the first height ranges from 0.7 to 1.7.

5. The magnetic memory device of claim 1, wherein the lower insulating pattern and the lower contact pattern are on an inner surface of the lower barrier pattern, wherein an upper surface of the lower insulating pattern and a lower surface of the lower contact pattern are in contact with each other, and wherein an upper surface of the lower contact pattern is at a same height as an upper surface of the lower barrier pattern.

6. The magnetic memory device of claim 2, wherein a lower surface of the lower electrode is in contact with an upper surface of the lower contact pattern and an upper surface of the lower barrier pattern.

7. The magnetic memory device of claim 1, wherein the lower insulating pattern has a height in a first direction perpendicular to an upper surface of the substrate, and wherein the height of the lower insulating pattern is 100 angstroms (Å) to 300 Å.

8. The magnetic memory device of claim 1, wherein the lower barrier pattern has a first thickness between the lower insulating pattern and the substrate in a first direction perpendicular to an upper surface of the substrate, and wherein the first thickness of the lower barrier pattern is 50 angstroms (Å) to 150 Å.

9. The magnetic memory device of claim 1, further comprising:

a lower wiring between the substrate and the lower contact plug, wherein the lower wiring is electrically connected to the lower contact plug; and an upper wiring on the data storage pattern, wherein the upper wiring is electrically connected to the data storage pattern.

10. The magnetic memory device of claim 9, wherein the lower wiring is in contact with a lower surface of the lower barrier pattern.

11. The magnetic memory device of claim 1, further comprising an etching stop layer on the substrate, wherein at least a portion of an outer surface of the lower contact plug is in contact with the etching stop layer.

12. A magnetic memory device comprising:

a substrate;

an interlayer insulating layer on the substrate;

a lower contact plug in the interlayer insulating layer; and a data storage pattern on the interlayer insulating layer and the lower contact plug, wherein the lower contact plug includes:

a lower barrier pattern on the substrate, wherein side surfaces of the lower barrier pattern are in contact with the interlayer insulating layer;

a lower insulating pattern on the lower barrier pattern, wherein lower surfaces and side surfaces of the lower insulating pattern are in contact with the lower barrier pattern; and a lower contact pattern on the lower insulating pattern, wherein a lower surface of the lower contact pattern is in contact with the lower insulating pattern, wherein a side surface of the lower contact pattern is in contact with the lower barrier pattern, and wherein the lower barrier pattern extends on at least a portion of the side surface of the lower contact pattern that is above an uppermost surface of the lower insulating pattern.

13. The magnetic memory device of claim 12, wherein the data storage pattern includes:

a lower electrode on the lower contact plug;

an upper electrode on the lower electrode; and a magnetic tunnel junction pattern between the lower electrode and the upper electrode.

14. The magnetic memory device of claim 12, wherein the lower contact pattern and the lower barrier pattern include TaN and/or TiN, and wherein the lower insulating pattern includes oxide.

15. The magnetic memory device of claim 12, wherein the lower contact plug has a first height in a first direction perpendicular to an upper surface of the substrate and a first width in a second direction parallel to the upper surface of the substrate, and wherein a ratio of the first width to the first height ranges from 0.7 to 1.7.

16. The magnetic memory device of claim 12, further comprising:

a lower wiring between the substrate and the lower contact plug, wherein the lower wiring is connected to the lower contact plug; and an upper wiring on the data storage pattern, wherein the upper wiring is connected to the data storage pattern.

17. The magnetic memory device of claim 12, wherein a second height of the lower insulating pattern in a first direction perpendicular to an upper surface of the substrate is 100 angstroms (Å) to 300 Å, and wherein the lower barrier pattern has a first thickness between the lower insulating pattern and the substrate in the first direction, and wherein the first thickness is 50 Å to 150 Å.

18. A magnetic memory device comprising:

a substrate;

a lower wiring on the substrate;

a lower contact plug on the lower wiring, wherein the lower contact plug is connected to the lower wiring;

a data storage pattern including a lower electrode, a magnetic tunnel junction pattern, and an upper electrode sequentially stacked on the lower contact plug; and an upper wiring disposed on the data storage pattern, wherein the upper wiring is connected to the data storage pattern, wherein the lower contact plug includes a lower metal pattern and a lower insulating pattern, wherein the lower metal pattern surrounds the lower insulating pattern, wherein the lower metal pattern extends between the lower insulating pattern and the lower wiring to be in contact with the lower wiring, wherein the lower metal pattern comprises a lower contact pattern and a lower barrier pattern, and wherein the lower barrier pattern extends at least on a portion of a side surface of the lower contact pattern that is above an uppermost surface of the lower insulating pattern.

19. The magnetic memory device of claim 18, wherein the lower metal pattern includes TaN and/or TiN, and wherein the lower insulating pattern includes oxide.

20. The magnetic memory device of claim 18, wherein the lower contact plug has a first height in a first direction perpendicular to an upper surface of the substrate and a first width in a second direction parallel to the upper surface of the substrate, and wherein a ratio of the first width to the first height ranges from 0.7 to 1.7.

* * * * *